(12) United States Patent
Blaszczyk et al.

(10) Patent No.: US 6,252,162 B1
(45) Date of Patent: Jun. 26, 2001

(54) LAMINATED FILTER APPARATUS AND METHOD FOR REDUCING ELECTROMAGNETIC INTERFERENCE

(75) Inventors: Marion Blaszczyk, Palos Hills; Dane L. Greives, Buffalo Grove; Gerald A. Greco, Elk Grove Village; William L. Stamos, Lombard, all of IL (US); John B. Borke, Gainesville, GA (US)

(73) Assignee: 3COM Corporation, Rolling Meadows, IL (US)

( * ) Notice: Subject to any disclaimer, the term of this patent is extended or adjusted under 35 U.S.C. 154(b) by 0 days.

(21) Appl. No.: 09/450,955

(22) Filed: Nov. 30, 1999

(51) Int. Cl.[7] .................................................. H05K 9/00
(52) U.S. Cl. ............................................................. 174/35 R
(58) Field of Search ................................... 174/32, 35 R, 174/35 MS, 110 R, 113 C

(56) References Cited

U.S. PATENT DOCUMENTS 3,612,744 * 10/1971 Thomas .

* cited by examiner

*Primary Examiner*—Edward H. Tso
(74) *Attorney, Agent, or Firm*—Baniak Pine & Gannon

(57) ABSTRACT

A laminated filter apparatus for reducing electromagnetic interference includes a first conductor having a first side and a second side. The laminated filter apparatus also includes a second conductor having a first side and a second side. A first insulative member is positioned between the first conductor and the second conductor and contacts the second side of the first conductor and the first side of the second conductor. A second insulative member includes a first side and a second side, the second side of the second insulative member contacts the first side of the first conductor. A third insulative member includes a first side and a second side, the first side of the third insulative member contacts the second side of the second conductor. A third conductor contacts the first side of the second insulative member and the second side of the third insulative member.

23 Claims, 3 Drawing Sheets

LAMINATED FILTER APPARATUS AND METHOD FOR REDUCING ELECTROMAGNETIC INTERFERENCE

FIELD OF THE INVENTION

This invention relates generally to the field of power filters used for chassis that house various electronic components. In particular, the invention relates to a laminated filter apparatus and method that provides an efficient and convenient means to reduce electromagnetic interference.

BACKGROUND OF THE INVENTION

Electronic devices for high-speed telecommunication and networking applications are typically housed in a metal chassis. Power is typically routed to the chassis by input power cables that are connected to a circuit board located along the backside of the chassis. This circuit board is commonly referred to as a backplane circuit board. The input power cables may, however, introduce unwanted noise and other transients into the chassis. Moreover, electromagnetic emissions generated within the chassis may exit the chassis and may propagate along the input power cables outside of the chassis.

To overcome these problems, a power line filter (i.e., electromagnetic interference/radio frequency interference filter) is typically mounted within the chassis to provide filtered power to the chassis. These filters are typically housed in a relatively large metal box-like housing having input terminals or lugs which extend through a side wall, and output cables that extend through the opposite side wall. Standard electrical capacitors are mounted within the box-like housing. The input terminals are operatively connected to one end of the capacitors, and the output cables are operatively connected to the other end of the capacitors.

Although the input terminals of a conventional filter may extend outside of the chassis, the box-like housing of the filter is typically positioned within the chassis near the top of the chassis. The input power cables to the chassis are typically attached directly to the input terminals of the filter. The output cables leading from the filter are then attached to a backplane circuit board to supply filtered power to the electronic components mounted within the chassis.

There are several disadvantages to these conventional power filters including their relatively large size. Electronic chassis typically have strict dimensional requirements, and the large size of conventional filters greatly reduces the amount space in the chassis that could otherwise be used for other various electronic functions. In addition, despite their large size, conventional filters typically are not very efficient in that they do not optimum filtering over a high frequency range with low impedance.

Moreover, mounting the housing of conventional filters within the chassis blocks the airflow through the chassis, which may result in the overheating of the various electronic components within the chassis. Also, mounting conventional filters within the chassis and routing their output cables to the backplane circuit board is a labor intensive and time consuming process that increases the installation time. Finally, there are typically high costs associated with the manufacture of conventional filters due to the number of parts required to construct the filter, and the complexity of the parts.

Accordingly, it would be desirable to have a laminated filter apparatus that overcomes the disadvantages described above, and to provide a simple and cost effective laminated filter for reducing electromagnetic interference.

SUMMARY OF THE INVENTION

One aspect of the invention provides a laminated filter apparatus for reducing electromagnetic interference including a first conductor having a first side and a second side. The laminated filter apparatus also includes a second conductor having a first side and a second side. The first insulative member is positioned between the first conductor and the second conductor. The first insulative member contacts the second side of the first conductor and the first side of the second conductor. A second insulative member includes a first side and a second side. The second side of the second insulative member contacts the first side of the first conductor. A third insulative member includes a first side and a second side. The first side of the third insulative member contacts the second side of the second conductor. A third conductor contacts the first side of the second insulative member and the second side of the third insulative member. The first, second, and third conductors each may preferably be planar members and each may be generally parallel to one another. The first, second, and third conductors each may preferably be comprised of metal. The first, second, and third insulative members each may preferably be planar members and each may be generally parallel to one another. The first, second, and third insulative members each may preferably be comprised of dielectric material. The third conductor may preferably include a surface for contacting with a chassis. The chassis may preferably be comprised of metal. An input terminal may preferably be operatively connected to the first conductor and may extend outward perpendicular from the first conductor. Similarly, an input terminal may preferably be operatively connected to the second conductor, and may extend outward perpendicular from the second conductor. The first conductor may preferably include a flange portion for connection to a circuit board disposed within a chassis. The flange portion may preferably extend outward perpendicular from the first conductor. Similarly, the second conductor may preferably include a flange portion for connection to a circuit board disposed within a chassis. The flange portion may preferably extend outward perpendicular from the second conductor. A first output cable may preferably extend from the first conductor and a second output cable may preferably extend from the second conductor. The first and second output cables may preferably be operatively connected to a fan assembly mounted within a chassis. At least the third conductor may preferably include a plurality of fasteners openings formed therein to allow the first, second, and third conductors and the first, second, and third insulative members to be secured to a chassis.

Another aspect of the invention provides a system for reducing electromagnetic interference. A first conductor having a first side and a second side and a second conductor having a first side and a second side are provided. A first insulative member is positioned between the first conductor and the second conductor and contacts the second side of the first conductor and the first side of the second conductor. A second insulative member includes a first side and a second side. The second side of the second insulative member contacts the first side of the first conductor. A third insulative member includes a first side and a second side. The first side of the third insulative member conductor contacts the second side of the second conductor. A third conductor contacts the first side of the second insulative member and the second side of the third insulative member. The third conductor includes a contact surface that contacts a chassis. The first and second conductors are each mounted to a circuit board disposed within the chassis to provide power to the circuit board. The first and second conductors each include at least one input terminal to allow a power cable to be attached to the at least one input terminal.

Another aspect of the invention provides a method of reducing electromagnetic interference. A first conductor having a first side and a second side is provided. A second conductor having a first side and a second side is also provided. A first insulative member is positioned between the first conductor and the second conductor. The first insulative member contacts the second side of the first conductor and the first side of the second conductor. A second insulative member includes a first side and a second side. The second side of the second insulative member contacts the first side of the first conductor. A third insulative member includes a first side and a second side. The first side of the third insulative member contacts the second side of the second conductor. A third conductor contacts the first side of the second insulative member and the second side of the third insulative member. The third conductor includes a contact surface. The contact surface is contacted with a chassis. The first and second conductors may preferably be mounted to a circuit board within the chassis. An input terminal operatively connected to the first conductor and an input terminal operatively connected to the second conductor are provided. A first input power cable may preferably be attached to the input terminal of the first conductor and a second input power cable may preferably be attached to the input terminal of the first conductor. Electromagnetic interference may preferably be reduced. A first output cable extending from the first conductor and a second output cable extending from the second conductor may preferably be provided. The first and second output cables may preferably be operatively connected to a fan assembly mounted within a chassis.

The invention provides the foregoing and other features, and the advantages of the invention will become further apparent from the following detailed description of the presently preferred embodiments, read in conjunction with the accompanying drawings. The detailed description and drawings are merely illustrative of the invention and do not limit the scope of the invention, which is defined by the appended claims and equivalents thereof.

DETAILED DESCRIPTION OF THE PRESENTLY PREFERRED EMBODIMENTS

Figure 1:
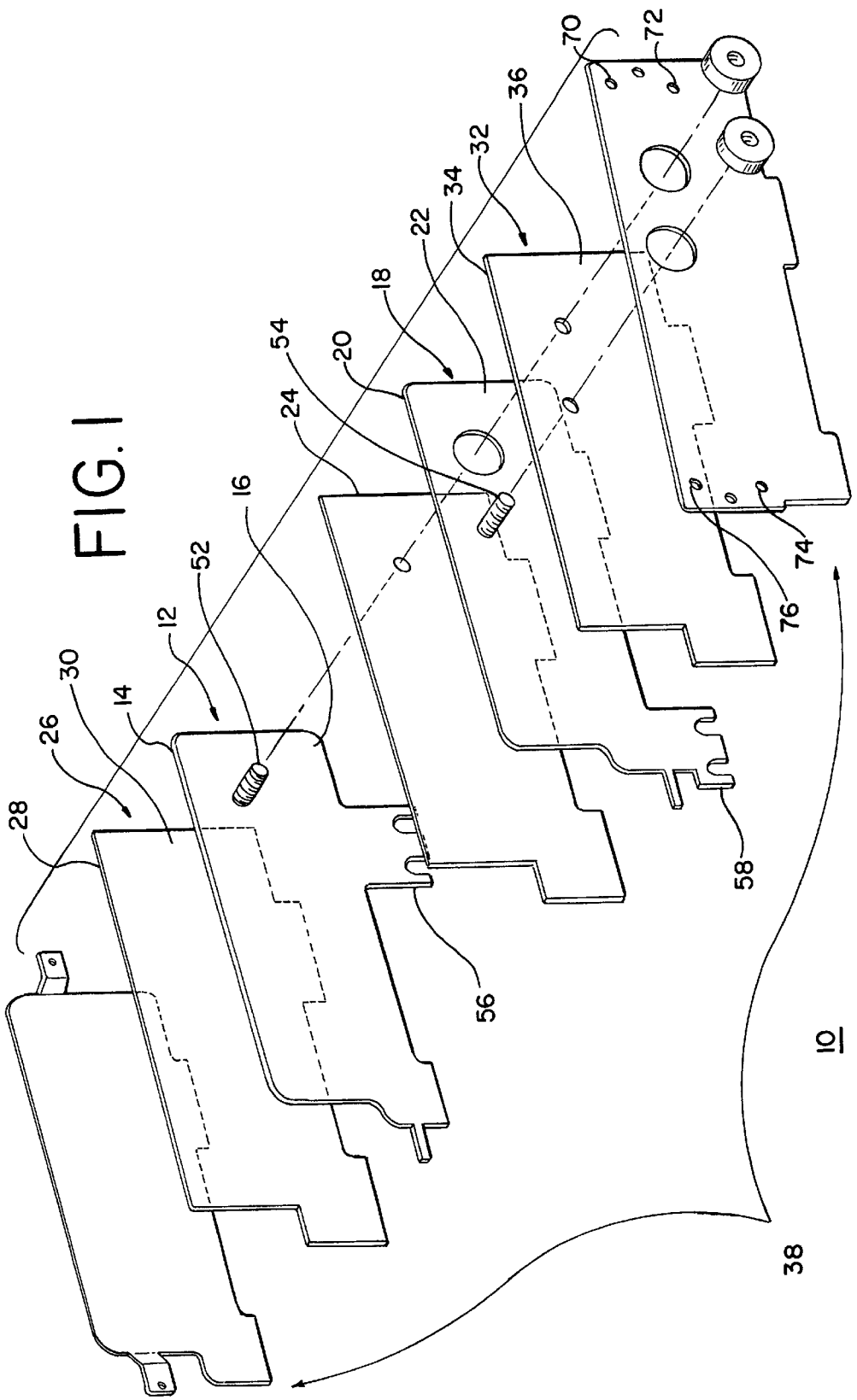
FIG. 1 is a perspective exploded view of a preferred embodiment of a laminated filter apparatus for reducing electromagnetic interference that is made in accordance with the invention.

As shown in FIGS. 1–4, and in particular FIG. 1, a preferred embodiment of a laminated filter apparatus 10 for reducing electromagnetic interference includes a first conductor 12 having a first side 14 and a second side 16. The laminated filter apparatus 10 also includes a second conductor 18 having a first side 20 and a second side 22. A first insulative member 24 is positioned between the first conductor 12 and the second conductor 18. The first insulative member 24 contacts the second side 16 of the first conductor 12 and the first side 20 of the second conductor 18. A second insulative member 26 includes a first side 28 and a second side 30. The second side 30 of the second insulative member 26 contacts the first side 14 of the first conductor 12. A third insulative member 32 includes a first side 34 and a second side 36. The first side 34 of the third insulative member 32 contacts the second side 22 of the second conductor 18. A third conductor 38 contacts the first side 28 of the second insulative member 26 and the second side 36 of the third insulative member 32.

In the embodiment shown in FIGS. 1–4, the first, second, and third conductors 12,18, 38 are each planar members and are each generally parallel to one another. The first, second, and third conductors 12,18, 38 may each preferably be comprised of any suitable conductive metal. The first, second, and third insulative members 24, 26, 32 are each planar members and are each generally parallel to one another. The first, second, and third insulative members 24, 26, 32 each may preferably be comprised of dielectric material. In the embodiment shown, the conductors 12, 18, 38 and insulative members 24, 26, 32 are laminated together to form the laminated filter apparatus 10. The conductors 12,18, 38 and insulative members 24, 26, 32 may be joined together by any conventional means. For example, adhesives may be used to join the various layers of material together. Alternatively, the conductors 12, 18, 38 and insulative members 24, 26, 32 may preferably be laminated together by any of the conventional mechanical means. For example, the conductors 12, 18, 38 and insulative members 24, 26, 32 may preferably be laminated together with screws, bolts, rivet, etc.

Figure 2:
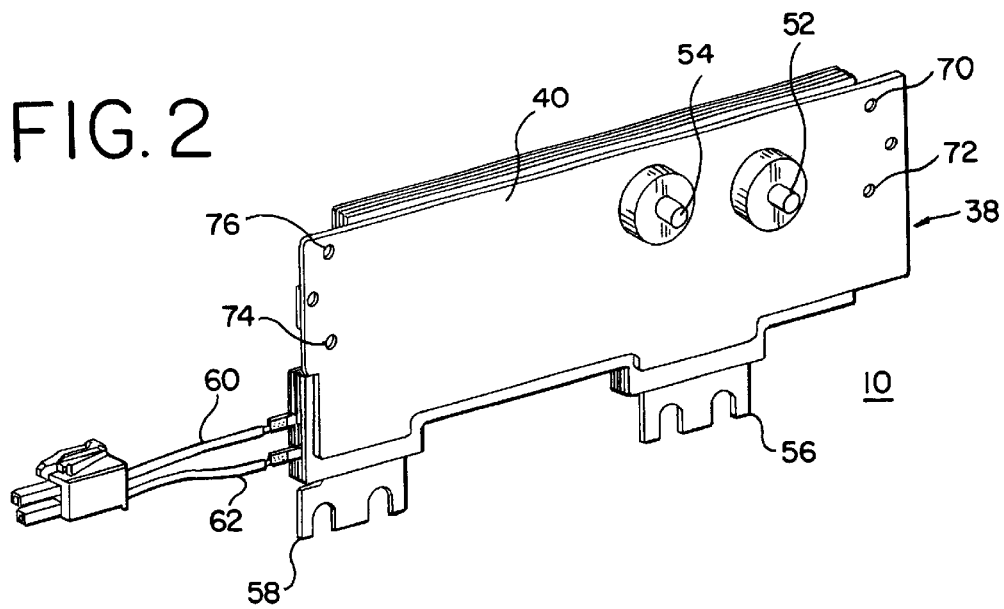
FIG. 2 is an assembled view of FIG. 1.
Figure 3:
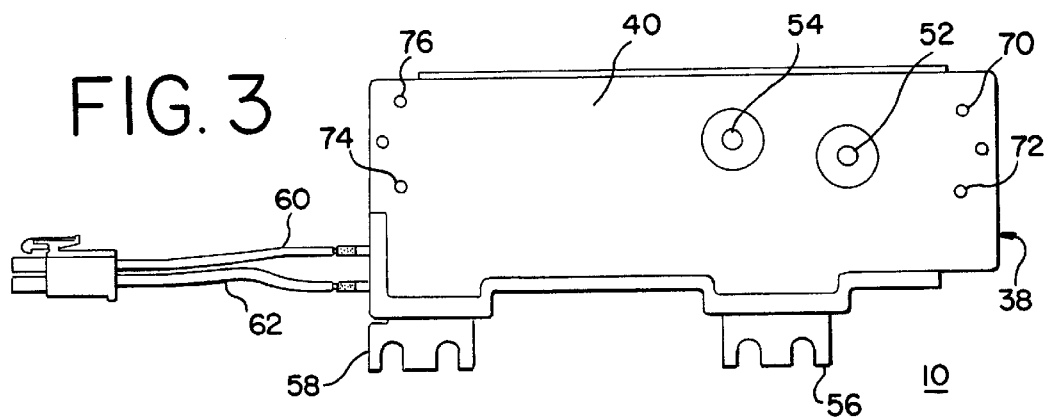
FIG. 3 is a front view of the embodiment of FIG. 2.
Figure 4:
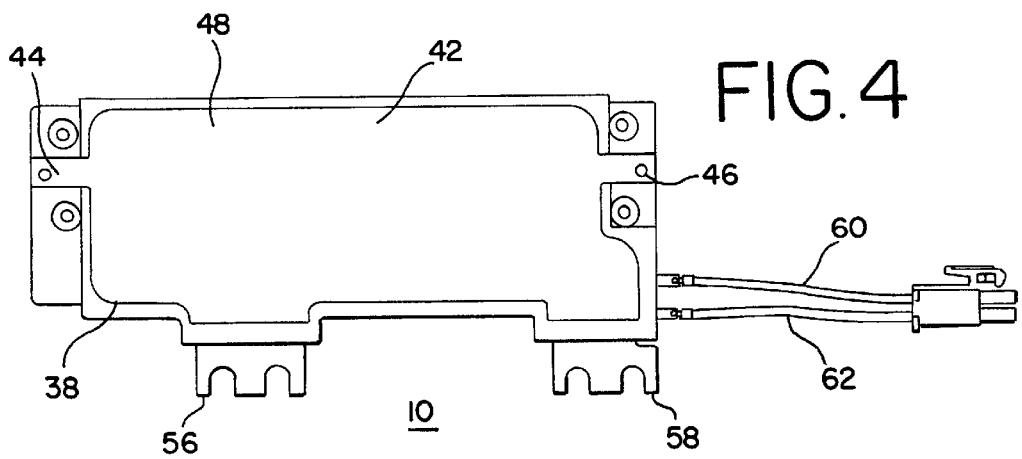
FIG. 4 is a back view of FIG. 3.

As shown in FIGS. 2–4, the third conductor 38 may preferably be comprised of a rigid first conductive member 40 and a second rigid conductive member 42 that are connected together at their ends by tab portions 44 and 46(see FIG. 4). In the embodiment shown, the tab portions 44 and 46 may preferably extend from the second conductive member 42 to the first conductive member 40. Alternatively, the third conductor 38 may be comprised of a flexible conductive material that extends around the first side 28 of the second insulative member 26 and the second side 36 of the third insulative member 32.

Figure 5:
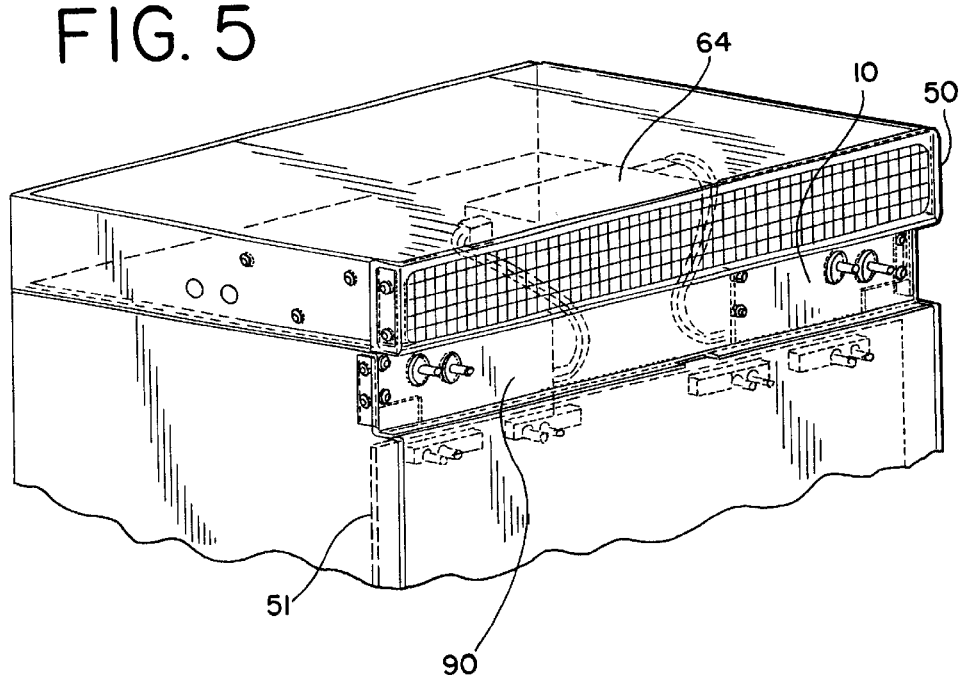
FIG. 5 is a perspective view of the laminated filter apparatus of FIG.1 mounted to a circuit board disposed within a chassis.
Figure 6:
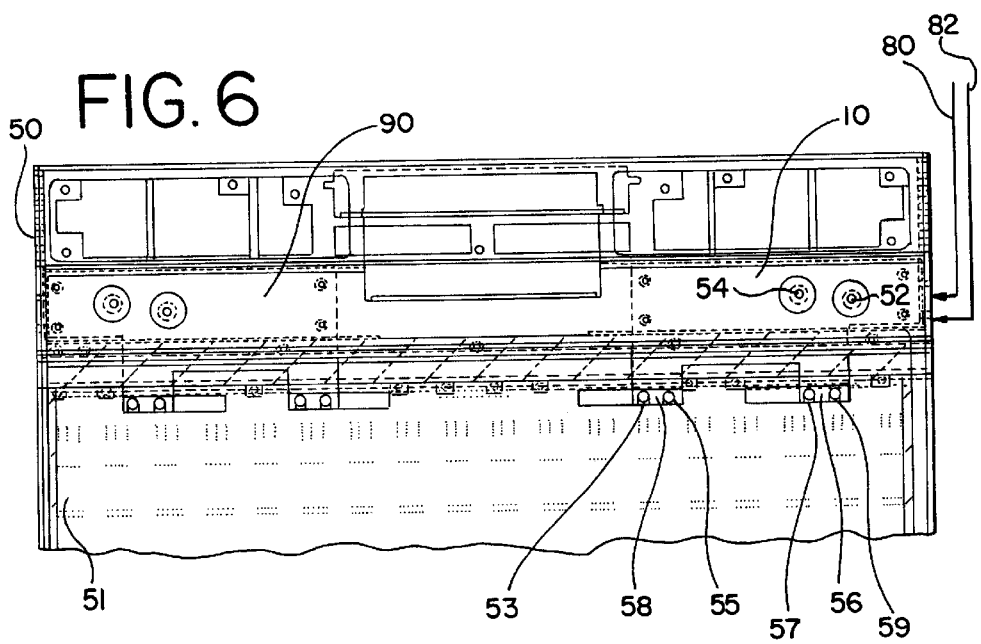
FIG. 6 is a plan view of the embodiment of FIG. 5.

As shown in FIGS. 5–6, the laminated filter apparatus 10 is adapted to be mounted to a chassis 50. In particular, the third conductor 38 includes a surface 48 (see FIG. 4) for contacting with a chassis 50. The chassis 50 may be any suitable metal enclosure for housing electronic devices that carry out various electronic functions such as, for example, high-speed telecommunications and networking functions. For example, the chassis 50 may house various high-speed application cards, switching cards, ingress and egress cards.

As shown in FIGS. 5–6, a circuit board 51 is disposed within the chassis 50 along the backside of the chassis 50. The circuit board 51 provides power to the various applications card that may be housed in the chassis 50.

Referring again to FIGS. 1–4, a first input terminal 52 may preferably be operatively connected to the first conductor 12. The first input terminal 52 extends outward perpendicular from the first conductor 12. A second input terminal 54 may preferably be operatively connected to the second conductor 18. The second input terminal may preferably extend outward perpendicular from the second conductor 18. The first and second input terminals 52, 54 may preferably be operatively connected to the first and second conductors 12, 18 by any conventional means.

As shown in FIGS. 1–4, the first conductor 12 preferably includes a flange portion 56 for connection the circuit board 51 disposed within a chassis 50. The flange portion 56 extends outward perpendicular from the first conductor 12. The second conductor 18 also preferably includes a flange portion 58 for connection to the circuit board 51. The flange portion 58 preferably extends outward perpendicular from the second conductor 18.

As shown in FIG. 6, the flange portions 56, 58 are adapted to connect with receiving lugs 53, 55, 57, 59 mounted on the circuit board 51. The advantage of this arrangement is that the first and second conductors 12, 18 can be quickly and easily mounted directly to the circuit board 51 via the flange portions 56 and 58. This eliminates the need for output cables to be routed from the laminated filter apparatus 10 to the circuit board 51, which in turn reduces the installation time required to install the filter apparatus 10. In the embodiment shown, a second laminated filter 90 may preferably be provided to provide filtering for a redundant power supply.

Referring to FIGS. 2–4, an output cable 60 may preferably extend from the first conductor 12 and a second output cable 62 may preferably extends from the second conductor 18. The first and second output cables 60, 62 may preferably be operatively connected to a fan assembly 64 mounted within a chassis 50 (see FIG. 5).

The laminated filter apparatus 10 may be fastened to the chassis 50 in any conventional manner. For example, as shown in FIGS. 1–4, the third conductor 38 may preferably include a plurality of fasteners openings 70, 72, 74, and 76 formed therein to allow the filter apparatus 10 to be secured to the chassis 50. The laminated filter apparatus 10 may be secured to the chassis 50 with any conventional fastener such as screws, bolts, etc. In the embodiment shown, the filter apparatus 10 is mounted to an outer surface of the chassis 50. The advantage of this arrangement is that the filter apparatus 10 does not occupy any space within the chassis 50, and therefore does not interfere with the flow of air through the chassis 50. This in turn ensures that the electronic components within the chassis 50 do not overheat. Moreover, this configuration results in more free space in the chassis 50 that can be used for other various electronic functions.

The laminated filter apparatus 10 may be used in conjunction with the chassis 50 to provide a system for reducing electromagnetic interference. The first and second conductors 12, 18 are each mounted directly (via flanges 56 and 58) to a circuit board 50. The laminated filter apparatus 10 is positioned against the chassis 50 so that the contact surface 48 (see FIG. 4) of the third conductor 38 contacts the chassis 50. The filter apparatus 10 can then be secured to the chassis 50 with any conventional fastener. Input power cables 80, 82 (see FIG. 6) are attached to the first and second input terminals 52, 54. The first and second output cables 60, 62 may be operatively connected to the fan assembly 64 mounted within a chassis 50.

The laminated filter apparatus 10 described above provides optimum filtering over a high range of frequencies with less impedance. This is due in part to the contact surface 48 of the third conductor 38 which provides a large area from which the electromagnetic interference that may appear on the first and second input terminals 52, 54 can be returned to the chassis 50 readily and easily with very little impedance. The laminated filter apparatus 10 provides a compact, efficient, and cost effective solution to reduce electromagnetic interference associated with chassis that house numerous electronic components.

While the embodiments of the invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

We claim:

1. A laminated filter apparatus for reducing electromagnetic interference comprising:
a first conductor having a first side and a second side, a second conductor having a first side and a second side, a first insulative member positioned between the first conductor and the second conductor, the first insulative member contacting the second side of the first conductor and the first side of the second conductor, a second insulative member including a first side and a second side, the second side of the second insulative member contacting the first side of the first conductor, a third insulative member including a first side and a second side, the first side of the third insulative member contacting the second side of the second conductor, and a third conductor contacting the first side of the second insulative member and the second side of the third insulative member.

2. The apparatus of claim 1 wherein the first, second, and third conductors are each planar members and are each generally parallel to one another.

3. The apparatus of claim 1 wherein the first, second, and third conductors are each comprised of metal.

4. The apparatus of claim 1 wherein the first, second, and third insulative members are each planar members and are each generally parallel to one another.

5. The apparatus of claim 1 wherein the first, second, and third insulative members are each comprised of dielectric material.

6. The apparatus of claim 1 wherein the third conductor includes a surface for contacting with a chassis.

7. The apparatus of claim 6 wherein the chassis is comprised of metal.

8. The apparatus of claim 1 further including an input terminal operatively connected to the first conductor.

9. The apparatus of claim 8 wherein the input terminal extends outward perpendicular from the first conductor.

10. The apparatus of claim 1 further including an input terminal operatively connected to the second conductor.

11. The apparatus of claim 10 wherein the input terminal extends outward perpendicular from the second conductor.

12. The apparatus of claim 1 wherein the first conductor includes a flange portion for connection to a circuit board disposed within a chassis.

13. The apparatus of claim 12 wherein the flange portion extends outward perpendicular from the first conductor.

14. The apparatus of claim 1 wherein the second conductor includes a flange portion for connection to a circuit board disposed within a chassis.

15. The apparatus of claim 14 wherein the flange portion extends outward perpendicular from the second conductor.

16. The apparatus of claim 1 further including a first output cable extending from the first conductor and a second output cable extending from the second conductor, the first and second output cables operatively connected to a fan assembly mounted within a chassis.

17. The apparatus of claim 1 wherein at least the third conductor includes a plurality of fasteners openings formed therein to allow the first, second, and third conductors and the first, second, and third insulative members to be secured to a chassis.

18. A system for reducing electromagnetic interference comprising:

a first conductor having a first side and a second side, a second conductor having a first side and a second side, a first insulative member positioned between the first conductor and the second conductor, the first insulative member contacting the second side of the first conductor and the first side of the second conductor, a second insulative member including a first side and a second side, the second side of the second insulative member contacting the first side of the first conductor, a third insulative member including a first side and a second side, the first side of the third insulative member conductor contacting the second side of the second conductor, a third conductor contacting the first side of the second insulative member and the second side of the third insulative member, the third conductor including a contact surface, the contact surface of the third conductor contacting a chassis, the first and second conductors each mounted to a circuit board disposed within the chassis to provide power to the circuit board, the first and second conductors each including at least one input terminal to allow a power cable to be attached to the at least one input terminal.

19. A method of reducing electromagnetic interference comprising the steps of:

providing a first conductor having a first side and a second side, a second conductor having a first side and a second side, a first insulative member positioned between the first conductor and the second conductor, the first insulative member contacting the second side of the first conductor and the first side of the second conductor, a second insulative member including a first side and a second side, the second side of the second insulative member contacting the first side of the first conductor, a third insulative member including a first side and a second side, the first side of the third insulative member contacting the second side of the second conductor, a third conductor contacting the first side of the second insulative member and the second side of the third insulative member, the third conductor including a contact surface; and contacting the contact surface with a chassis.

20. The method of claim 19 further comprising the steps of:

mounting the first and second conductors to a circuit board within the chassis.

21. The method of claim 19 further comprising the steps of:

providing an input terminal operatively connected to the first conductor and an input terminal operatively connected to the second conductor;

attaching a first input power cable to the input terminal of the first conductor; and attaching a second input power cable to the input terminal of the first conductor.

22. The method of claim 19 further comprising the steps of:

reducing electromagnetic interference.

23. The method of claim 19 further comprising the steps of:

providing a first output cable extending from the first conductor and a second output cable extending from the second conductor; and operatively connecting the first and second output cables to a fan assembly mounted within a chassis.

* * * * *